(12) United States Patent
Koo et al.

(10) Patent No.: US 12,373,006 B2
(45) Date of Patent: Jul. 29, 2025

(54) STRETCHABLE ELECTRONIC DEVICE

(71) Applicant: Electronics and Telecommunications Research Institute, Daejeon (KR)

(72) Inventors: Jae Bon Koo, Daejeon (KR); Ji-Young Oh, Daejeon (KR); Himchan Oh, Daejeon (KR); Chan Woo Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 217 days.

(21) Appl. No.: 18/315,247

(22) Filed: May 10, 2023

(65) Prior Publication Data
US 2023/0384832 A1 Nov. 30, 2023

(30) Foreign Application Priority Data
May 26, 2022 (KR) ........................ 10-2022-0064777

(51) Int. Cl.
*G06F 1/16* (2006.01)
(52) U.S. Cl.
CPC ................. *G06F 1/1652* (2013.01)
(58) Field of Classification Search
CPC ........ G06F 1/1652; H05K 2201/09263; H05K 2201/09727; H05K 1/0283; H05K 1/0313; H05K 1/189
See application file for complete search history.

(56) References Cited

U.S. PATENT DOCUMENTS 7,265,298 B2 * 9/2007 Maghribi ............... H05K 1/118
428/209
9,841,548 B2 * 12/2017 Kim ..................... G06F 1/1643
(Continued)

FOREIGN PATENT DOCUMENTS

KR 10-2015-0125946 11/2015
KR 10-1755207 7/2017
(Continued)

OTHER PUBLICATIONS

Matsuhisa et al., "Printable elastic conductors with a high conductivity for electronic textile applications", Nature Communications, Jun. 25, 2015, pp. 1-11.
(Continued)

*Primary Examiner* — Rockshana D Chowdhury
(74) *Attorney, Agent, or Firm* — KILE PARK REED & HOUTTEMAN PLLC (57) ABSTRACT

Provided is a stretchable electronic device. The stretchable electronic device includes: a substrate; a plurality of electronic elements disposed on the substrate; and a line part configured to connect the electronic elements on the substrate and having a curved portion. Here, the line part includes: an insulator; and a plurality of metal lines disposed on the insulator, and the metal lines include: outermost metal lines adjacent to edges of the insulator; and inner metal lines disposed between the outermost metal lines. Also, a first ratio of a first distance between the outermost metal lines and the edges of the insulator to a first width of each of the outermost metal lines is greater than a second ratio of a second distance between the inner metal lines to a second width of each of the inner metal lines.

7 Claims, 9 Drawing Sheets

(56) References Cited

U.S. PATENT DOCUMENTS

| | | | |
|---|---|---|---|
| 9,844,133 B2* | 12/2017 | Tomita | H05K 1/038 |
| 10,292,261 B2 | 5/2019 | Rogers et al. | |
| 10,497,633 B2 | 12/2019 | Rogers et al. | |
| 10,649,496 B2 | 5/2020 | Choi et al. | |
| 10,892,314 B2* | 1/2021 | Kim | H10K 59/122 |
| 10,923,551 B2* | 2/2021 | Zhou | H10K 59/131 |
| 10,959,326 B2* | 3/2021 | Okimoto | H05K 1/118 |
| 10,964,769 B2* | 3/2021 | Park | H10K 59/124 |
| 11,259,404 B2* | 2/2022 | Hwang | H05K 1/0283 |
| 11,367,845 B2* | 6/2022 | Zhai | H10K 77/111 |
| 11,380,857 B2* | 7/2022 | Wang | H10K 71/00 |
| 11,501,667 B2* | 11/2022 | Sui | H10K 59/122 |
| 11,776,971 B2* | 10/2023 | Sui | H10D 86/60 257/79 |
| 11,930,593 B2* | 3/2024 | Keum | H05K 1/0313 |
| 12,033,544 B2* | 7/2024 | Kim | G06F 1/1652 |
| 12,041,718 B2* | 7/2024 | Wang | H05K 1/0283 |
| 12,041,827 B2* | 7/2024 | Yi | H10K 77/111 |
| 12,050,245 B2* | 7/2024 | Thei | G01R 31/2884 |
| 12,101,989 B2* | 9/2024 | Park | H10K 59/80 |
| 12,127,337 B2* | 10/2024 | Sano | H05K 1/028 |
| 12,169,618 B2* | 12/2024 | Sano | G06F 3/0446 |
| 12,191,425 B2* | 1/2025 | Yang | H01L 25/0753 |
| 2009/0283891 A1* | 11/2009 | Dekker | H01L 24/01 257/E23.177 |
| 2009/0317639 A1* | 12/2009 | Axisa | H05K 1/0283 428/411.1 |
| 2014/0299362 A1* | 10/2014 | Park | H05K 1/0283 174/254 |
| 2015/0065840 A1* | 3/2015 | Bailey | H05K 1/0283 174/251 |
| 2015/0173186 A1* | 6/2015 | Na | H05K 1/0283 29/850 |
| 2015/0380355 A1* | 12/2015 | Rogers | H01L 24/97 257/773 |
| 2016/0105950 A1* | 4/2016 | Drzaic | H05K 3/0014 156/196 |
| 2016/0162774 A1* | 6/2016 | Mei | G06K 19/07722 235/488 |
| 2016/0278204 A1* | 9/2016 | Li | A61B 5/6833 |
| 2018/0046221 A1* | 2/2018 | Choi | H05B 33/22 |
| 2018/0114825 A1* | 4/2018 | Hong | H10K 59/38 |
| 2018/0263114 A1* | 9/2018 | Ogura | H05K 1/189 |
| 2020/0037442 A1* | 1/2020 | Keum | H05K 1/118 |
| 2020/0281075 A1* | 9/2020 | Wang | G09F 9/30 |
| 2020/0312248 A1* | 10/2020 | Shin | G09G 3/3291 |
| 2021/0234108 A1* | 7/2021 | Sano | H10K 59/131 |
| 2021/0280827 A1 | 9/2021 | Oh et al. | |
| 2022/0061153 A1* | 2/2022 | Ke | H05K 1/181 |
| 2022/0104343 A1 | 3/2022 | Oh et al. | |
| 2023/0384832 A1* | 11/2023 | Koo | G06F 1/1652 |
| 2024/0379528 A1* | 11/2024 | Kao | H10D 1/714 |

FOREIGN PATENT DOCUMENTS

| | | |
|---|---|---|
| KR | 10-1810050 | 12/2017 |
| KR | 10-2021-0082061 | 7/2021 |
| KR | 10-2021-0112246 | 9/2021 |
| KR | 10-2022-0043011 | 4/2022 |

OTHER PUBLICATIONS

Sun et al., "Controlled buckling of semiconductor nanoribbons for stretchable electronics", nature nanotechnology, Dec. 5, 2006, pp. 201-207, vol. 1.

Gray et al., "High-Conductivity Elastomeric Electronics", Advanced Materials, Mar. 5, 2004, pp. 393-397, vol. 16, No. 5.

* cited by examiner

STRETCHABLE ELECTRONIC DEVICE

CROSS-REFERENCE TO RELATED APPLICATIONS

This U.S. non-provisional patent application claims priority under 35 U.S.C. § 119 of Korean Patent Application No. 10-2022-0064777, filed on May 26, 2022, the entire contents of which are hereby incorporated by reference.

BACKGROUND

The present disclosure herein relates to a structure of lines in a stretchable electronic device.

In recent years, stretchable display devices attract attention with development of display-related technologies, and accordingly, researches on stretchable display have been performed.

Two main methods for implementing the stretchable display will be described below. A first method secures stretchability by using a substrate made of an elastic material and providing wrinkles on the substrate. That is, the stretchability may be secured by transferring a circuit manufactured on a substrate onto a pre-stretched elastic substrate to provide the wrinkles on the circuit board.

A second method secures stretchability in a line area connecting islands. The second method has high compatibility with a typical flexible display process, but has a disadvantage in that a resolution is not high due to characteristics of a line shape that occupies a large space. Thus, development on a key element technology for precisely manufacturing the stretchable line is required to realize a high resolution through this method.

SUMMARY

The present disclosure provides a device that stably supplies current by improving a stretching and contracting rate and repetition reliability of a line applied to a display.

The present disclosure also provides a structure that improves a stretching and contracting characteristic of a line to which stress is concentrated when at least one line including a curved portion is disposed between electronic elements.

The object of the present invention is not limited to the aforesaid, but other objects not described herein will be clearly understood by those skilled in the art from descriptions below.

An embodiment of the inventive concept provides a stretchable electronic device including: a substrate; a plurality of electronic elements disposed on the substrate; and a line part configured to connect the electronic elements on the substrate and having a curved portion. Here, the line part includes: an insulator; and a plurality of metal lines disposed on the insulator, and the metal lines include: outermost metal lines adjacent to edges of the insulator; and inner metal lines disposed between the outermost metal lines. Also, a first ratio of a first distance between the outermost metal lines and the edges of the insulator to a first width of each of the outermost metal lines is greater than a second ratio of a second distance between the inner metal lines to a second width of each of the inner metal lines.

In an embodiment, the first distance between the outermost metal lines may be greater than the second distance between the inner metal lines.

In an embodiment, the first width of each of the outermost metal lines may be less than the second width of each of the inner metal lines.

In an embodiment, the insulator may include a polymer material.

In an embodiment, the electronic elements may be spaced apart from each other on the substrate, the line part may be provided in plurality, and two electronic elements adjacent to each other among the electronic elements may be electrically connected by at least one or more line parts.

In an embodiment of the inventive concept, a stretchable electronic device includes: a substrate; a plurality of electronic elements disposed on the substrate; and a line group configured to connect the electronic elements on the substrate. Here, the line group includes: outermost line parts; and inner line parts disposed between the outermost line parts, and each of the outermost line parts and the inner line parts includes: an insulator; and one metal line disposed on the insulator. Also, each of the outermost line parts and the inner line parts has a curved portion, and a first ratio of a second width of the insulator of the outermost line parts to a first width of the metal line of the outermost line parts is greater than a second ratio of a fourth width of the insulator of the inner line parts to a third width of the metal line of the inner line parts.

In an embodiment, the second width of the insulator of the outermost line parts may be greater than the fourth width of the insulator of the inner line parts.

In an embodiment, the first width of the metal line of the outermost line parts may be less than the third width of the metal line of the inner line parts.

In an embodiment, the insulator may include a polymer material.

In an embodiment, the electronic elements may be spaced apart from each other on the substrate, and the line group may be provided in plurality. Here, two electronic elements adjacent to each other among the electronic elements may be electrically connected by at least one or more line groups.

In an embodiment, the outermost line parts may be spaced apart from the inner line parts in a horizontal direction.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Preferred embodiments of the present invention will be described with reference to the accompanying drawings so as to sufficiently understand constitutions and effects of the present invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. A person with ordinary skill in the technical field of the present invention pertains will be understood that the present invention can be carried out under any appropriate environments.

In the following description, the technical terms are used only for explaining a specific exemplary embodiment while not limiting the present disclosure. In the specification, the terms of a singular form may include plural forms unless referred to the contrary. The meaning of 'comprises' and/or 'comprising' specifies a component, a step, an operation and/or an element does not exclude other components, steps, operations and/or elements.

Unless terms used in embodiments of the present invention are differently defined, the terms may be construed as meanings that are commonly known to a person skilled in the art.

Hereinafter, a stretchable electronic device according to an embodiment of the inventive concept will be described with reference to the accompanying drawings.

The stretchable electronic device may be stretched or contacted in at least one direction by external force. For example, the stretchable electronic device may be stretched or contacted in a longitudinal direction thereof. In a predetermined embodiment, the stretchable electronic device may be stretched or contacted in all directions. The stretchable electronic device may be freely deformed in shape. The stretchable electronic device may refer to an output device capable of outputting visual information although the stretchable electronic device is deformed in shape. Thus, the stretchable electronic device may be disposed on a non-flat surface. The stretchable electronic device may be deformed in shape depending on a surface on which the stretchable electronic device is disposed. The stretchable electronic device may be reversibly stretched or contracted. For example, the stretchable electronic device may be stretched when external force is applied and returned to an original shape when the external force is removed. Thus, the stretchable electronic device may be repeatedly stretched and contracted. The stretchable electronic device may be used for an output device. The stretchable electronic device may be used for a wearable communication device or a body-embedded or attached bio-device. However, the embodiment of the inventive concept is not limited to the application of the stretchable electronic device.

Figure 1:
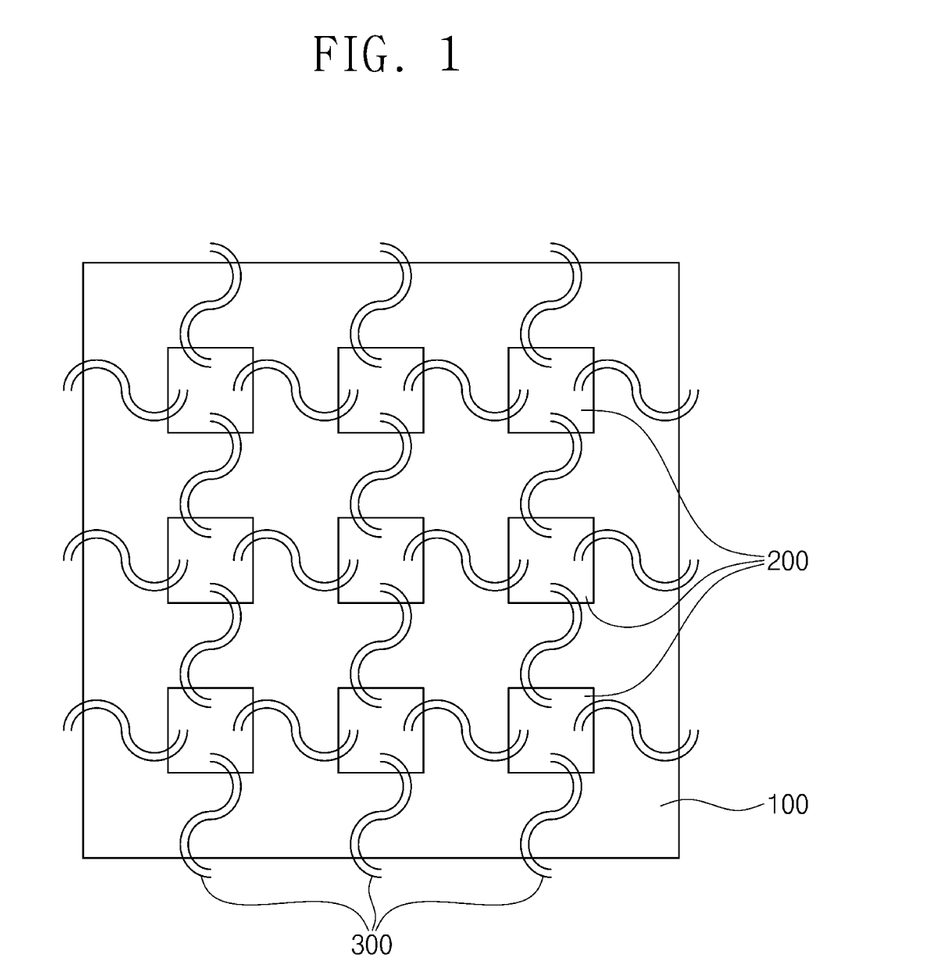
FIG. 1 is a plan view illustrating a stretchable electronic device according to embodiments of the inventive concept.

FIG. 1 is a plan view illustrating a stretchable electronic device according to embodiments of the inventive concept. Although a shape of a line part is schematically illustrated for convenience, the embodiment of the inventive concept is not limited to the shape of the line part in FIG. 1.

Referring to FIG. 1, the stretchable electronic device may include a substrate 100, an electronic element 200, and a line part 300. The substrate 100 may include a flexible substrate. For example, the substrate 100 may be made of an elastomer. The substrate 100 may be made of polydimethylsiloxane (PDM) or polyurethane (PU). However, the embodiment of the inventive concept is not limited to the material of the substrate 100. For example, the substrate 100 may be made of various materials that are usable for the flexible substrate. The substrate 100 may be stretched or contracted by external force. Here, the substrate 100 may be stretched or contracted in one direction or two directions. Alternatively, the substrate 100 may be stretched or contracted in all directions. The substrate 100 may have a shape that is deformed according to stretching or contracting of the stretchable electronic device. The substrate 100 may be provided for supporting or protecting various components of the stretchable electronic device.

A plurality of electronic elements 200 may be disposed on the substrate 100. The plurality of electronic elements 200 may be spaced apart from each other on the substrate 100. The plurality of electronic elements 200 may be arranged in a first direction and a second direction, which cross each other and are parallel to a top surface of the substrate 100. For example, as illustrated in FIG. 1, the plurality of electronic elements 200 may be arranged in a lattice shape along the first direction and the second direction. When the stretchable electronic device is an output device capable of outputting visual information, each of the plurality of electronic elements 200 may constitute one pixel of the output device. However, the embodiment of the inventive concept is not limited thereto. For example, the plurality of electronic elements 200 may be arranged in various shapes as necessary.

A plurality of line parts 300 may be disposed on the substrate 100. The plurality of line parts 300 may be connected to the plurality of electronic elements 200, respectively. For example, a pair of electronic elements 200 that are adjacent to each other may be connected to both ends of one line part 300, respectively. The electronic elements 200 arranged in the first direction and the second direction may be connected by the plurality of line parts 300. The plurality of line parts 300 may electrically connect the electronic elements 200 to each other.

The shape and number of each of the substrate 100, the plurality of electronic elements 200, and the plurality of line parts 300 in FIG. 1 are illustrative. For example, the shape and number of each of the substrate 100, the plurality of electronic elements 200, and the plurality of line parts 300 may be variously changed as necessary.

Hereinafter, the shape of the plurality of line parts 300 will be described based on one line part 300. The line part 300 may include at least one curved portion. The line part 300 may include at least one linear portion connected to the curved portion. In an embodiment, the curved portion may be provided in plurality. For example, in terms of a plane, the line part 300 may have a zigzag shape, a spiral shape, or a spring shape. However, the embodiment of the inventive concept is not limited to the shape of the line part 300. For example, the line part 300 may have various shapes including the curved portion. The line part 300 may extend from one electronic element 200 to another electronic element 200 adjacent thereto. The line part 300 may be stretched or contracted in at least one direction. For example, the line part 300 may be stretched or contracted between the one electronic element 200 and the another electronic element 200, and thus, a distance between the one electronic element 200 and the another electronic element 200 may be varied. When the line part 300 is stretched in a direction away from the one electronic element 200 and the another electronic element 200, the line part 300 may be deformed into a linear shape. When the line part 300 stretched or contracted by external force, stress that is locally concentrated in the line part 300 may be relieved. This will be described later in detail. The line part 300 may include one insulator and one or more metal lines. Hereinafter, a structure of the line part 300 will be described in detail.

Figure 2:
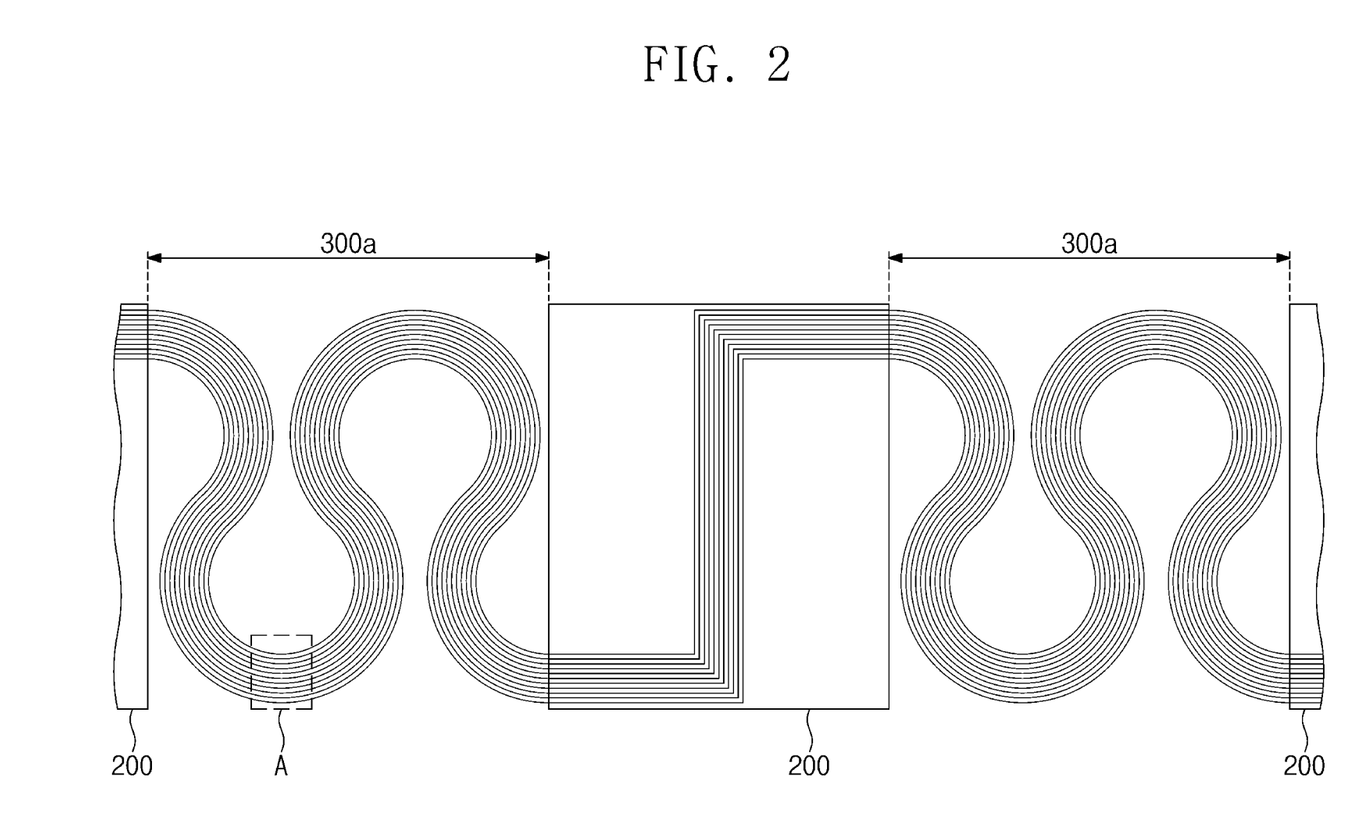
FIG. 2 is a plan view illustrating a stretchable electronic device according to embodiments of the inventive concept.
Figure 3:
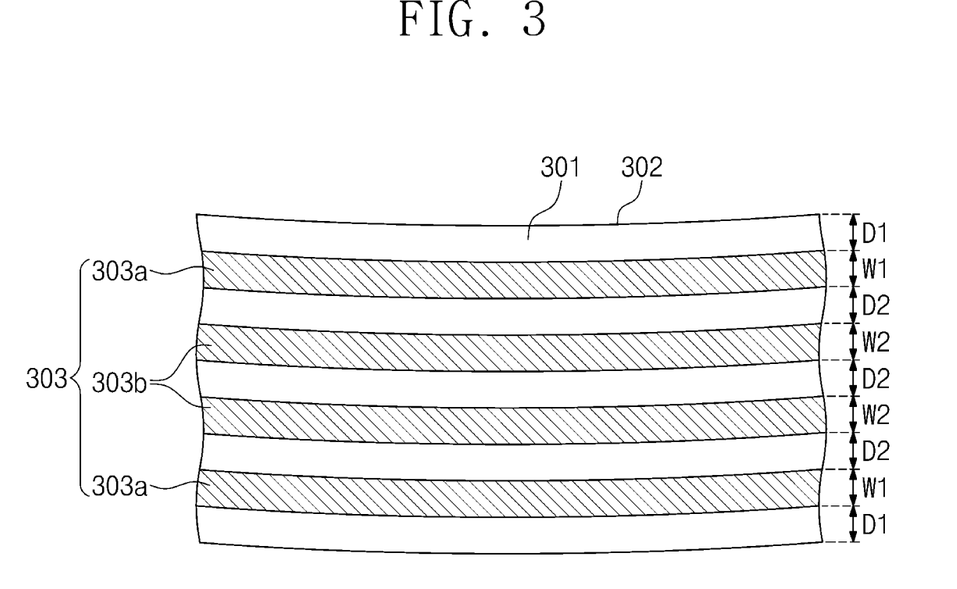
FIG. 3 is an enlarged view illustrating an area A of FIG. 2 according to embodiments of the inventive concept.

FIG. 2 is a plan view illustrating the stretchable electronic device according to the embodiments of the inventive concept. FIG. 2 is a view illustrating a partial area of FIG. 1 in more detail. FIG. 3 is an enlarged view illustrating a region A of FIG. 2.

Referring to FIGS. 2 and 3, the plurality of electronic elements 200 may be electrically connected by first line parts 300*a*. Each of the first line parts 300*a* of the stretchable electronic device may include an insulator 301 and a plurality of metal lines 303 disposed on the insulator 301. Hereinafter, the first line parts 300*a* will be described based on one first line part 300*a*.

The first line part 300*a* may include one insulator 301 and the plurality of metal lines 303 corresponding thereto. That is, the first line part 300*a* may be provided as a multi-track line part. As illustrated in FIGS. 2 and 3, although four metal lines 303 are disposed on one insulator 301, the embodiment of the inventive concept is not limited to the number of the metal lines 303 provided to one first line part 300*a*. For example, the metal line 303 may include a plurality of lines for driving and a line for preventing disconnection and a defect.

The pair of electronic elements 200 that are adjacent to each other may be connected by at least one first line part 300*a*. For example, when the number of lines required between the pair of electronic elements 200 is 4, two first line parts 300*a* each having two metal lines 303 may be provided to connect the pair of electronic elements 200. Alternatively, one first line part 300*a* having three metal lines 303 and one first line part 300*a* having one metal line 303 may be provided to connect the pair of electronic elements 200. Alternatively, one first line part 300*a* having four metal lines 303 may be provided to connect the pair of electronic elements 200. However, the embodiment of the inventive concept is not limited to the number of first line parts 300*a* and the number and arrangement of metal lines 303. For example, the number of first line parts 300*a* and the number and arrangement of metal lines 303 may be varied for easiness of a design of the stretchable electronic device. Hereinafter, descriptions will be continued based on embodiments of FIGS. 2 and 3.

The insulator 301 may be provided to support the metal line 303. The insulator 301 may be a material to be patterned. The insulator 301 may be made of an insulating material. The insulator 301 may be a flexible material. The insulator 301 may include a polymer material. For example, the insulator 301 may include polyimide. However, the embodiment of the inventive concept is not limited to the material of the insulator 301.

The metal lines 303 may be disposed on the insulator 301. The metal lines 303 may be spaced apart from each other in a horizontal direction on the insulator 301. For example, the metal lines 303 may be spaced apart from each other in a direction crossing both edges 302 of the insulator 301. The first line part 300*a* may have a sandwich structure of showing portions of the insulator 301 between the metal lines 303 when viewed from above the metal lines 303. The metal line 303 may include a conductive material. For example, the metal line 303 may include gold, silver, platinum, copper, nickel, chromium, aluminum, tungsten, titanium, palladium, or an alloy thereof. However, the embodiment of the inventive concept is not limited to the material of the metal line 303.

The metal lines 303 may include outermost metal lines 303*a* that are most adjacent to the both edges 302 of the insulator and at least one inner metal lines 303*b* disposed between the outermost metal lines 303*a*.

A width W1 of each of the metal lines 303*a* may be different from a width W2 of each of the metal lines 303*b*. A distance D2 between the metal lines 303*a* and 303*b* may be different from a distance D1 between the outermost metal lines 303*a* and the edges 302 of the insulator 301. More specifically, a first ratio of the distance D1 between the outermost metal lines 303*a* and the edges 302 of the insulator 301 to the width W1 of each of the outermost metal lines 303*a* may be greater than a second ratio of the distance D2 between the inner metal lines 303*b* to the width W2 of each of the inner metal lines 303*b*. Thus, stress applied to the outermost metal lines 303*a* to which stress is concentrated may be reduced as the first line part 300*a* is bent by external force. As the stress applied to the outermost metal lines 303*a* is reduced, a stretching and contracting rate and repetition reliability of the first line part 300*a* may increase. Also, when the width W1 of each of the outermost metal lines 303*a* is adjusted to be less than the width W2 of each of the inner metal lines 303*b*, a stretching and contracting rate may be maintained although stress is concentrated. As a result, the outermost metal lines 303*a* may be prevented from being damaged even by repeated stretching, contraction, and deformation of the first line part 300*a*, and current may be stably supplied through the lines 303. Also, an electrical conduction property of the stretchable electronic device including the first line part 300*a* may be prevented from being degraded or lost. Hereinafter, embodiments in which the first ratio is greater than the second ratio will be described with reference to FIGS. 4 to 6.

Figure 4:
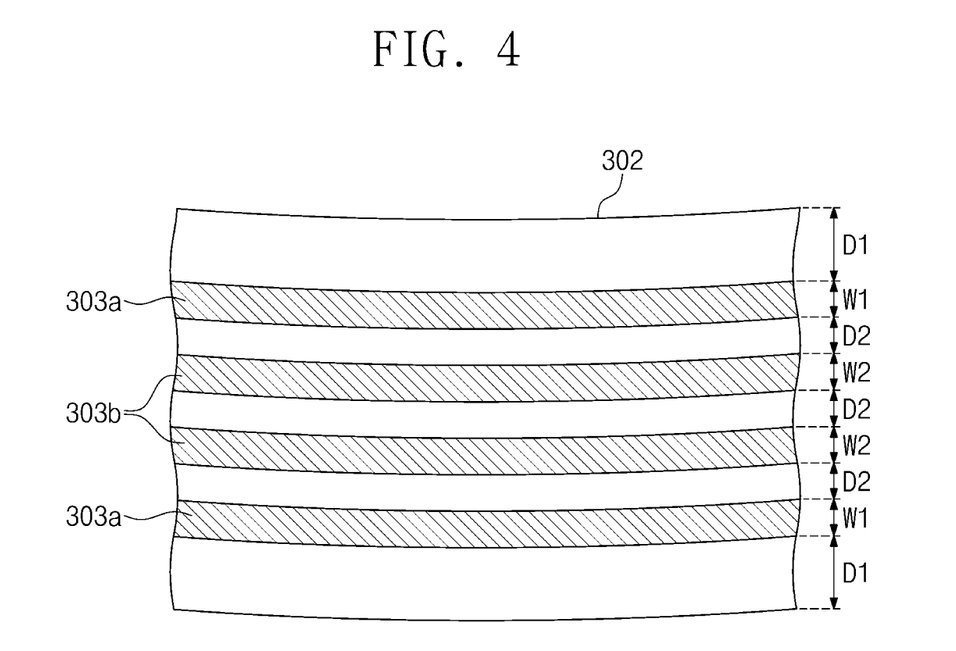
FIG. 4 is an enlarged view illustrating the area A of FIG. 2 according to embodiments of the inventive concept.

FIG. 4 is an enlarged view illustrating an area A of FIG. 2 according to embodiments of the inventive concept.

Referring to FIG. 4, a first ratio of the distance D1 between the outermost metal lines 303*a* and the edges 302 of the insulator 301 to the width W1 of each of the outermost metal lines 303*a* may be greater than a second ratio of the distance D2 between the inner metal lines 303*b* to the width W2 of each of the inner metal lines 303*b*. For example, when the width W1 of each of the outermost metal lines 303*a* is equal to the width W2 of each of the inner metal lines 303*b*, the distance D1 between the outermost metal lines 303*a* and the edges 302 of the insulator 301 may be greater than the distance D2 between the inner metal lines 303*b*.

Figure 5:
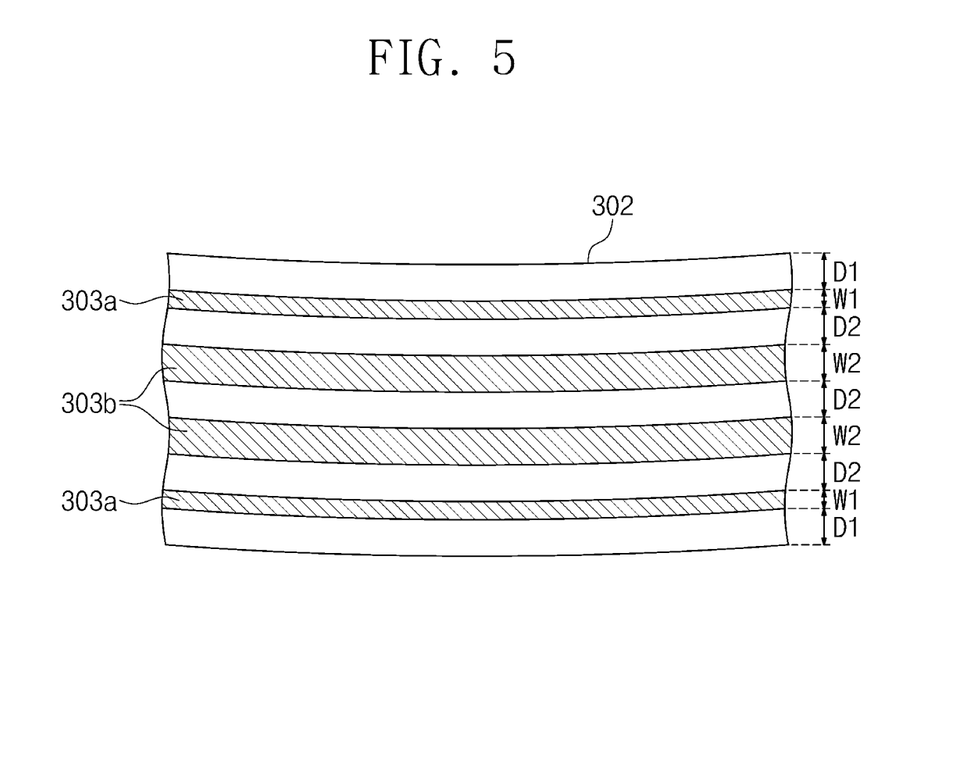
FIG. 5 is an enlarged view illustrating the area A of FIG. 2 according to embodiments of the inventive concept.

FIG. 5 is an enlarged view illustrating an area A of FIG. 2 according to embodiments of the inventive concept.

Referring to FIG. 5, a first ratio of the distance D1 between the outermost metal lines 303*a* and the edges 302 of the insulator 301 to the width W1 of each of the outermost metal lines 303*a* may be greater than a second ratio of the distance D2 between the inner metal lines 303*b* to the width W2 of each of the inner metal lines 303*b*. For example, when the distance D1 between the outermost metal lines 303*a* and the edges 302 of the insulator 301 is equal to the distance D2 between the inner metal lines 303*b*, the width W1 of each of the outermost metal lines 303*a* may be less than the width W2 of each of the inner metal lines 303*b*.

Figure 6:
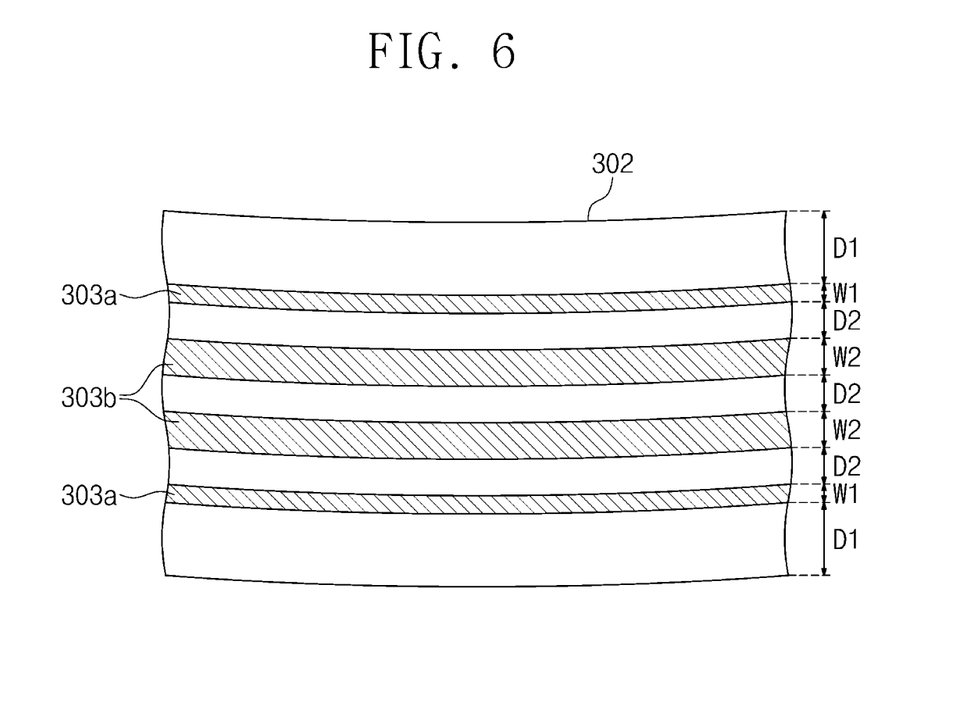
FIG. 6 is an enlarged view illustrating the area A of FIG. 2 according to embodiments of the inventive concept.

FIG. 6 is an enlarged view illustrating an area A of FIG. 2 according to embodiments of the inventive concept.

Referring to FIG. 6, a first line part 300*a* may have all of features of the first line part 300*a* described with reference to FIG. 4 and features of the first line part 300a described with reference to FIG. 5. A first ratio of the distance D1 between the outermost metal lines 303a and the edges 302 of the insulator 301 to the width W1 of each of the outermost metal lines 303a may be greater than a second ratio of the distance D2 between the inner metal lines 303b to the width W2 of each of the inner metal lines 303b. For example, the distance D1 between the outermost metal lines 303a and the edges 302 of the insulator 301 may be greater than the distance D2 between the inner metal lines 303b, and at the same time, the width W1 of each of the outermost metal lines 303a may be less than the width W2 of each of the inner metal lines 303b.

Figure 7:
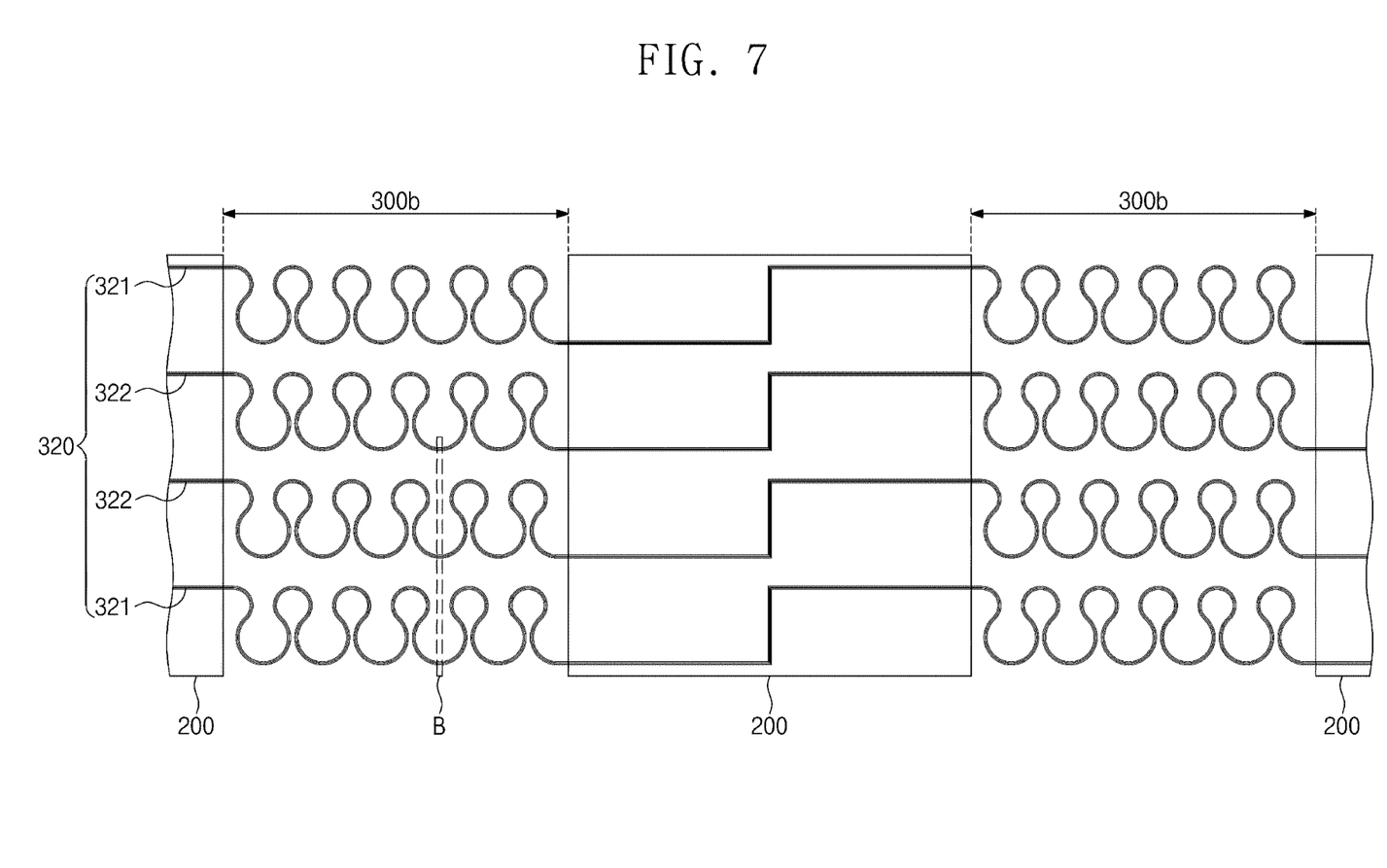
FIG. 7 is a plan view illustrating a stretchable electronic device according to embodiments of the inventive concept.
Figure 8:
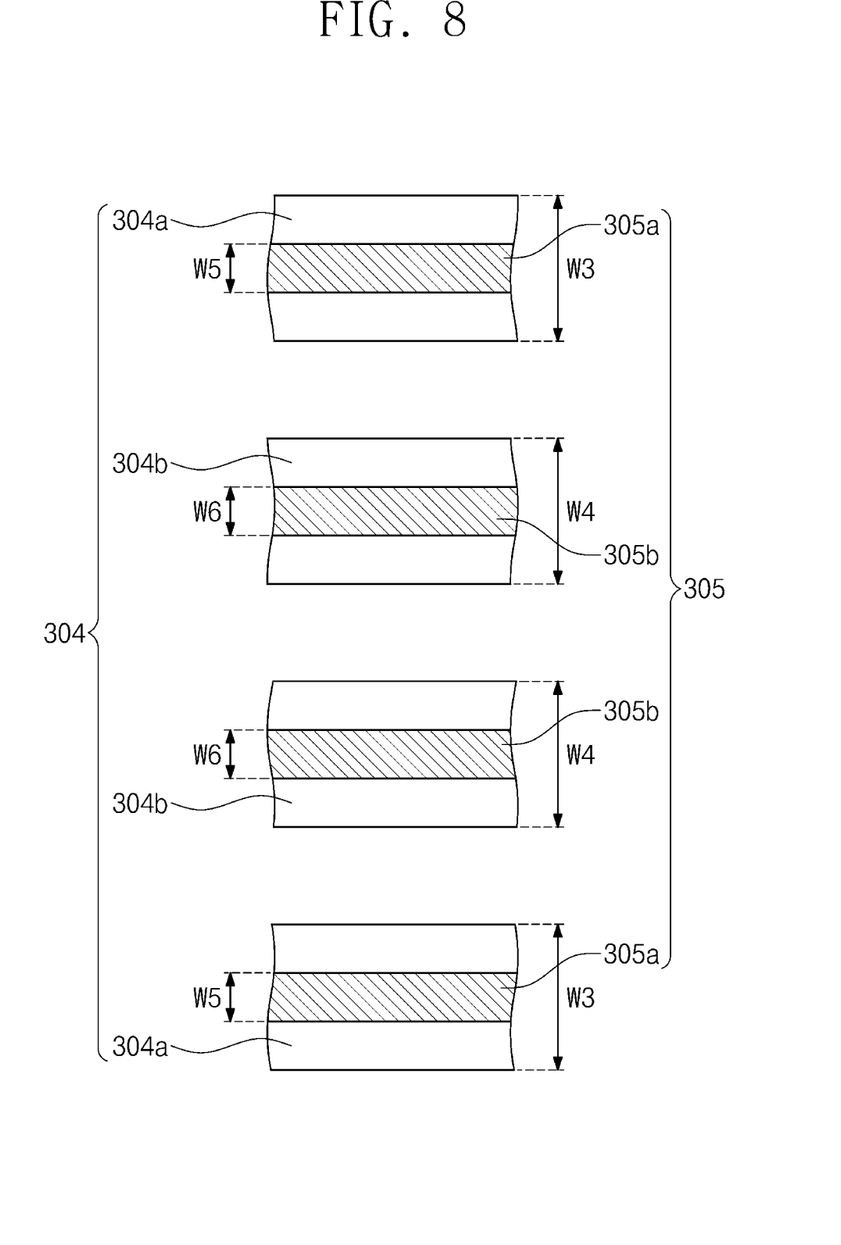
FIG. 8 is an enlarged view illustrating an area B of FIG. 7 according to embodiments of the inventive concept.

FIG. 7 is a plan view illustrating a stretchable electronic device according to embodiments of the inventive concept. FIG. 8 is an enlarged view illustrating an area B of FIG. 7 according to embodiments of the inventive concept.

Since a stretchable electronic device according to another embodiment of the inventive concept is different only in terms of an internal structure of a first line part 300a and a line group 300b according to an embodiment of the inventive concept, redundant descriptions will be omitted, and only the structure of the line group 300b will be described in detail.

Referring to FIGS. 7 and 8, a stretchable electronic device may include a line group 300b instead of the first line part 300a (refer to FIG. 2). A plurality of line groups 300b may be connected to a plurality of electronic elements 200, respectively. For example, a pair of electronic elements 200 that are adjacent to each other may be connected to both ends of one line group 300b, respectively. The line group 300b may electrically connect the electronic elements 200 to each other.

Hereinafter, a shape of each of the line groups 300b will be described based on one line group 300b. The line group 300b may include at least one curved portion. The line group 300b may include a linear portion connected to the curved portion. For example, in terms of a plane, the line group 300b may have a zigzag shape, a spiral shape, or a spring shape. The line group 300b may extend from one electronic element 200 to another electronic element 200 adjacent thereto. Hereinafter, a structure of the line group 300b will be described in detail.

The line group 300b may include at least one or more second line parts 320. The second line parts 320 may connect a pair of electronic elements 200 adjacent to each other in parallel. As illustrated in FIG. 7, although the line group 300b includes four second line parts 320, the embodiment of the inventive concept is not limited thereto. The number of second line parts 320 contained in the line group 300b may be varied as necessary.

Each of the second line parts 320 may include one metal line 305 disposed on one insulator 304. That is, each of the second line parts 300 may be provided as a single-track line part.

The second line parts 300 may include two outermost line parts 321 disposed at outer sides in the line group 300b and at least one inner line part 322 disposed between the outermost line parts 321. The outermost line parts 321 and the inner line part 322 may be spaced apart from each other in the horizontal direction.

The metal lines 305 may have different widths from each other. The insulators 304 of the line parts 320 may have different widths from each other. More specifically, a third ratio of a width W3 of an insulator 304a of the outermost line parts 321 to a width W5 of a metal line 305a of the outermost line parts 321 may be greater than a fourth ratio of a width W4 of an insulator 304b of the inner line parts 322 to a width W6 of a metal line 305b of the inner line parts 322. Thus, stress applied to the metal line 305a of the outermost line parts 321 to which stress is concentrated may be reduced as the line group 300b is bent by external force. As the stress applied to the metal line 305a of the outermost line parts 321 is reduced, a stretching and contracting rate and repetition reliability of the second line part 320 may increase. Also, when the width W5 of the metal line 305a of the outermost line parts 321 is adjusted, the stretching and contracting rate may be maintained although the stress is locally concentrated. As a result, current may be stably supplied although the line group 300b is repeatedly stretched, contracted, and deformed. Also, an electrical conduction property of the stretchable electronic device including the line group 300b may be prevented from being degraded or lost. Hereinafter, embodiments in which the third ratio is greater than the fourth ratio will be described with reference to FIGS. 9 to 11.

Figure 9:
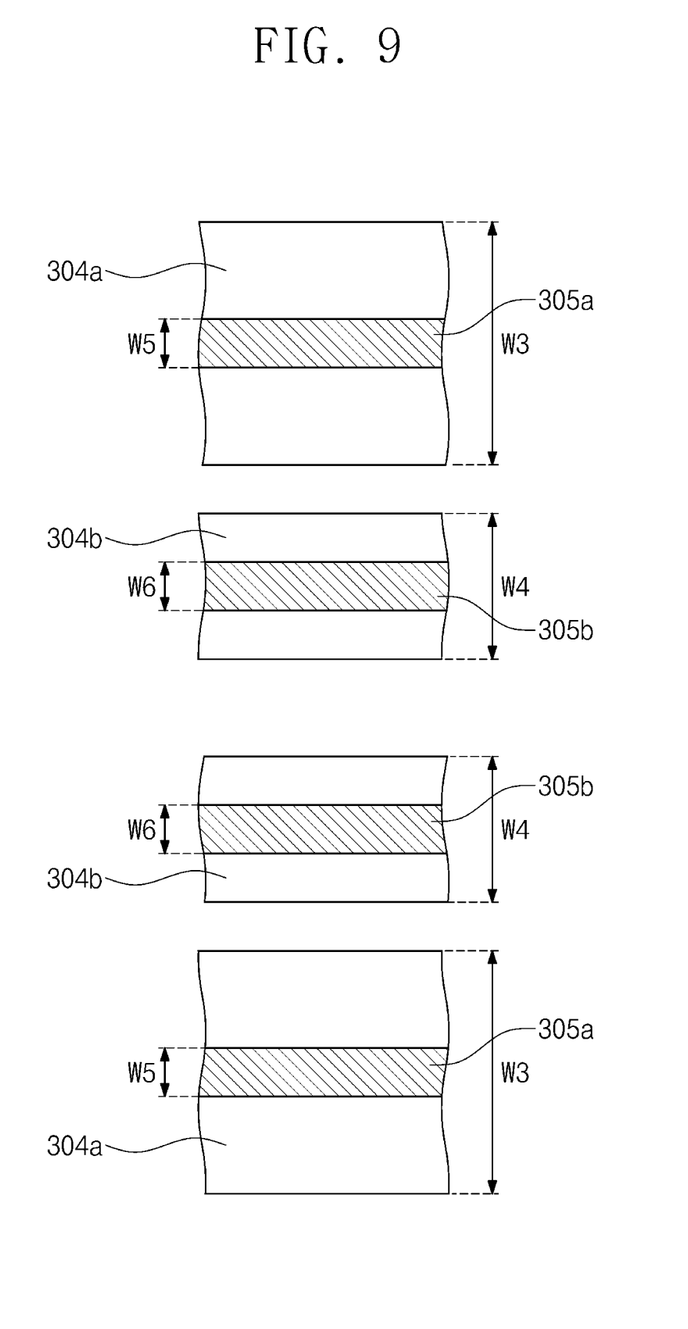
FIG. 9 is an enlarged view illustrating the area B of FIG. 7 according to embodiments of the inventive concept.

FIG. 9 is an enlarged view illustrating the area B of FIG. 7 according to embodiments of the inventive concept.

Referring to FIG. 9, a ratio of a width W3 of an insulator 304a of the outermost line parts 321 to a width W5 of a metal line 305a of the outermost line parts 321 may be greater than a ratio of a width W4 of an insulator 304b of the inner line parts 322 to a width W6 of a metal line 305b of the inner line parts 322. For example, when the width W5 of the metal line 305a of the outermost line parts 321 is equal to the width W6 of the metal line 305b of the inner line parts 322, the width W3 of the insulator 304a of the outermost line parts 321 may be greater than the width W4 of the insulator 304b of the inner line parts 322.

Figure 10:
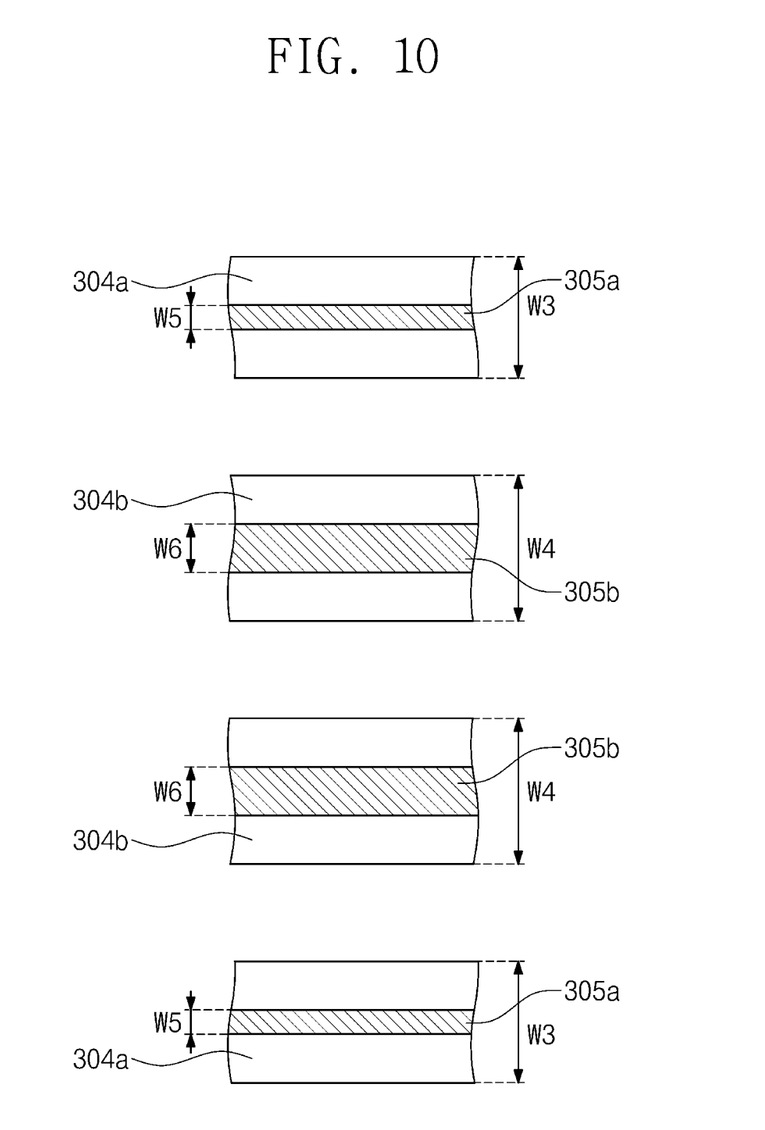
FIG. 10 is an enlarged view illustrating the area B of FIG. 7 according to embodiments of the inventive concept.

FIG. 10 is an enlarged view illustrating the area B of FIG. 7 according to embodiments of the inventive concept.

Referring to FIG. 10, a ratio of a width W3 of an insulator 304a of the outermost line parts 321 to a width W5 of a metal line 305a of the outermost line parts 321 may be greater than a ratio of a width W4 of an insulator 304b of the inner line parts 322 to a width W6 of a metal line 305b of the inner line parts 322. For example, when the width W3 of the insulator 304a of the outermost line parts 321 is equal to the width W4 of the insulator 304b of the inner line parts 322, the width W5 of the metal line 305a of the outermost line parts 321 may be less than the width W6 of the metal line 305b of the inner line parts 322.

Figure 11:
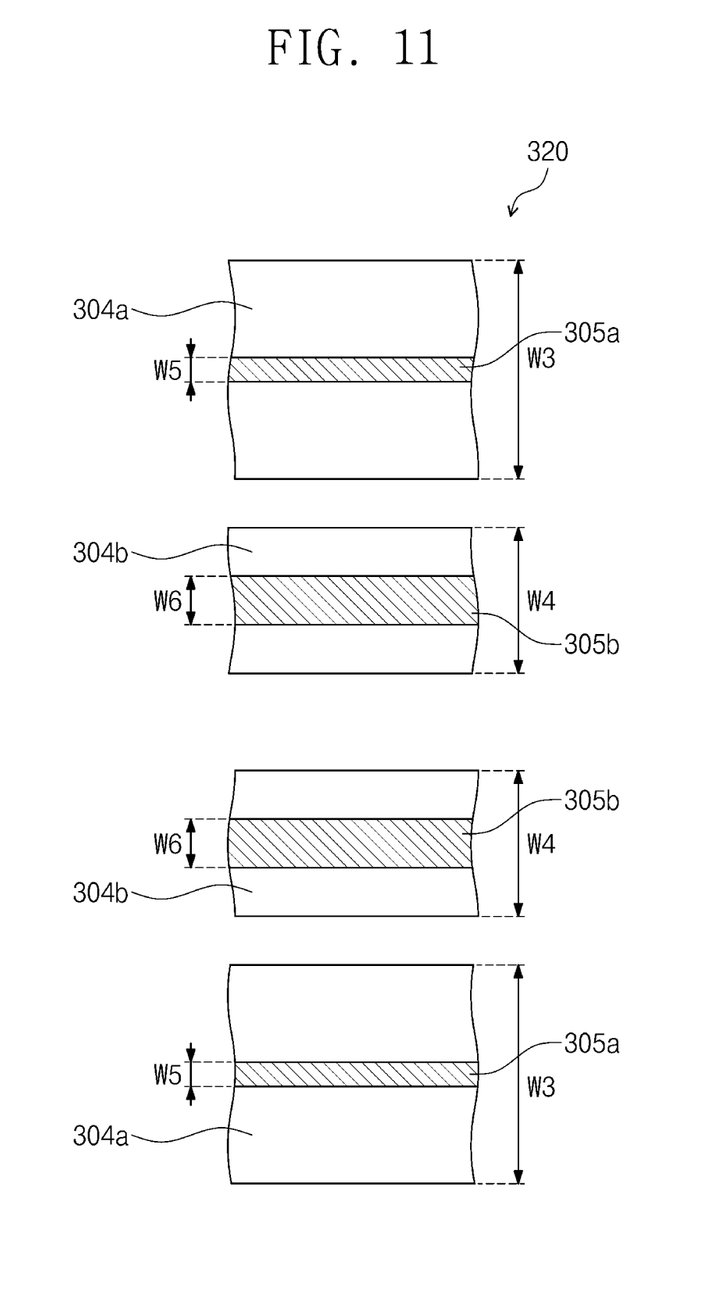
FIG. 11 is an enlarged view illustrating the area B of FIG. 7 according to embodiments of the inventive concept.

FIG. 11 is an enlarged view illustrating the area B of FIG. 7 according to embodiments of the inventive concept.

Referring to FIG. 11, second line parts 320 may have all of features of the second line parts 320 described with reference to FIG. 9 and features of the second line parts 320 described with reference to FIG. 10. A ratio of a width W3 of an insulator 304a of the outermost line parts 321 to a width W5 of a metal line 305a of the outermost line parts 321 may be greater than a ratio of a width W4 of an insulator 304b of the inner line parts 322 to a width W6 of a metal line 305b of the inner line parts 322. For example, the width W4 of the insulator 304b of the inner line parts 322 may be greater than the width W3 of the insulator 304a of the outermost line parts 321, and at the same time, the width W5 of the metal line 305a of the outermost line parts 321 may be less than the width W6 of the metal line 305b of the inner line parts 322.

According to the embodiments of the inventive concept, the stretchable electronic device having the improved stretching and contracting rate and repetition reliability may be provided.

According to the embodiments of the inventive concept, the stress concentration rate of the outer line to which the stress is concentrated when the stretchable electronic device is stretched and contracted may be reduced. That is, the stretchable electronic device having the high structural stability may be provided.

According to the embodiments of the inventive concept, the line may not be damaged when the stretchable electronic device is deformed and repeatedly stretched and contracted, and thus the current may be stably supplied through the line. That is, the stretchable electronic device having the high driving stability may be provided.

Although the embodiments of the present invention have been described, it is understood that the present invention should not be limited to these embodiments but various changes and modifications can be made by one ordinary skilled in the art within the spirit and scope of the present invention as hereinafter claimed. Thus, the above-disclosed embodiments are to be considered illustrative and not restrictive.

What is claimed is:

1. A stretchable electronic device comprising:
a substrate;
a plurality of electronic elements disposed on the substrate; and
a line part configured to connect the electronic elements on the substrate and having a curved portion,
wherein the line part comprises:
an insulator; and
a plurality of metal lines disposed on the insulator, and the metal lines comprise:
outermost metal lines adjacent to edges of the insulator; and
inner metal lines disposed between the outermost metal lines,
wherein a first ratio of a first distance between the outermost metal lines and the edges of the insulator to a first width of each of the outermost metal lines is greater than a second ratio of a second distance between the inner metal lines to a second width of each of the inner metal lines,
wherein the first distance between the outermost metal lines is greater than the second distance between the inner metal lines, and
wherein the first width of each of the outermost metal lines is less than the second width of each of the inner metal lines.

2. The stretchable electronic device of claim 1, wherein the insulator comprises a polymer material.

3. The stretchable electronic device of claim 1, wherein the electronic elements are spaced apart from each other on the substrate, and
the line part is provided in plurality,
wherein two electronic elements adjacent to each other among the electronic elements are electrically connected by at least one or more line parts.

4. A stretchable electronic device comprising:
a substrate;
a plurality of electronic elements disposed on the substrate; and
a line group configured to connect the electronic elements on the substrate,
wherein the line group comprises:
outermost line parts; and
inner line parts disposed between the outermost line parts, and
each of the outermost line parts and the inner line parts comprises:
an insulator; and
one metal line disposed on the insulator,
wherein each of the outermost line parts and the inner line parts has a curved portion, and
a first ratio of a second width of the insulator of the outermost line parts to a first width of the metal line of the outermost line parts is greater than a second ratio of a fourth width of the insulator of the inner line parts to a third width of the metal line of the inner line parts,
wherein the second width of the insulator of the outermost line parts is greater than the fourth width of the insulator of the inner line parts, and
wherein the first width of the metal line of the outermost line parts is less than the third width of the metal line of the inner line parts.

5. The stretchable electronic device of claim 4, wherein the insulator comprises a polymer material.

6. The stretchable electronic device of claim 4, wherein the electronic elements are spaced apart from each other on the substrate, and
the line group is provided in plurality,
wherein two electronic elements adjacent to each other among the electronic elements are electrically connected by at least one or more line groups.

7. The stretchable electronic device of claim 4, wherein the outermost line parts are spaced apart from the inner line parts in a horizontal direction.

* * * * *